[19] United States Patent
Corbett

[11] Patent Number: 6,113,992
[45] Date of Patent: Sep. 5, 2000

[54] LASER MAKING TECHNIQUES

[75] Inventor: Tim J. Corbett, Boise, Id.

[73] Assignee: Micron Technology, Inc., Boise, Id.

[21] Appl. No.: 09/358,178

[22] Filed: Jul. 20, 1999

Related U.S. Application Data

[63] Continuation of application No. 08/944,684, Sep. 30, 1997, Pat. No. 5,985,377, which is a continuation of application No. 08/584,246, Jan. 11, 1996, abandoned.

[51] Int. Cl.[7] .................................................... C08J 7/04
[52] U.S. Cl. ............................ 427/511; 427/58; 427/261; 427/264; 427/271; 427/385.5; 427/510; 427/514; 427/555; 437/1; 437/225; 437/928; 437/935; 437/936
[58] Field of Search ........................... 427/510, 511, 427/514, 555, 58, 261, 264, 271, 385.5; 437/1, 928, 935, 936, 225

[56] References Cited

U.S. PATENT DOCUMENTS

| | | |
|---|---|---|
| 3,751,587 | 8/1973 | Insler et al. . |
| 4,148,057 | 4/1979 | Jesse . |
| 4,375,025 | 2/1983 | Carlson . |
| 4,585,931 | 4/1986 | Duncan et al. . |
| 4,638,144 | 1/1987 | Latta, Jr. . |
| 4,707,722 | 11/1987 | Folk et al. . |
| 4,719,502 | 1/1988 | Ikeya et al. . |
| 4,753,863 | 6/1988 | Spanjer . |
| 4,861,620 | 8/1989 | Azuma et al. . |
| 4,945,204 | 7/1990 | Nakamura et al. . |
| 5,030,551 | 7/1991 | Herren et al. . |
| 5,157,412 | 10/1992 | Kleinschmidt et al. . |
| 5,206,280 | 4/1993 | Williams . |
| 5,262,470 | 11/1993 | Shimotsuma et al. . |
| 5,329,090 | 7/1994 | Woelki et al. . |
| 5,346,802 | 9/1994 | Ohbachi et al. . |
| 5,357,077 | 10/1994 | Tsuruta . |
| 5,373,039 | 12/1994 | Sakai et al. . |
| 5,413,629 | 5/1995 | Yasui et al. . |
| 5,445,923 | 8/1995 | Takahashi et al. . |

*Primary Examiner*—Bernard Pianalto
*Attorney, Agent, or Firm*—Trask Britt

[57] ABSTRACT

A laser marking apparatus and method for marking the surface of a semiconductor chip are described herein. A laser beam is directed to a location on the surface of the chip where a laser reactive material, such as a pigment containing epoxy, is present. The heat associated with the laser beam causes the laser reactive material to fuse to the surface of the chip, creating a visibly distinct mark in contrast to the rest of the surface of the chip. Only reactive material contacted by the laser fuses to the chip surface, and the remaining residue on the non-irradiated portion can be readily removed.

49 Claims, 6 Drawing Sheets

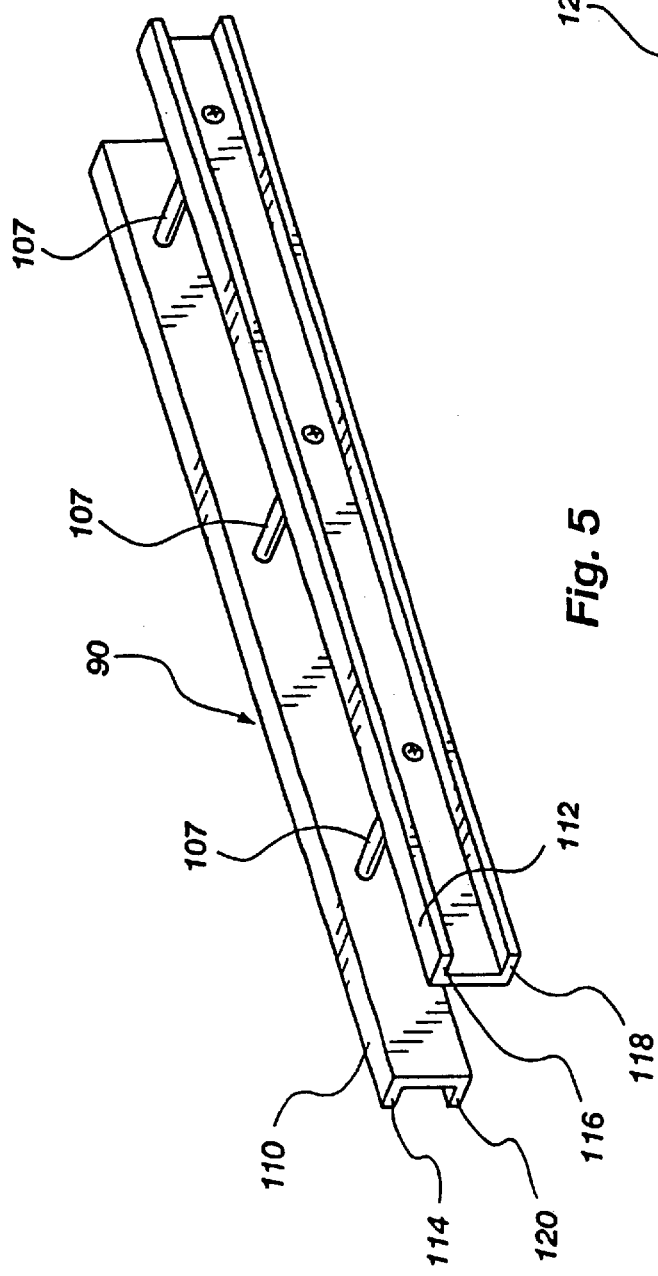
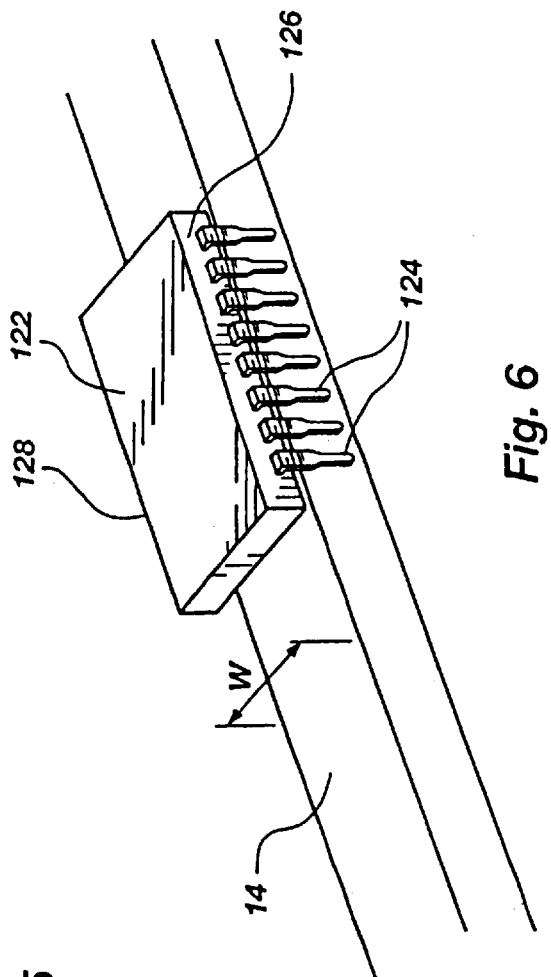
Fig. 5
Fig. 6

LASER MAKING TECHNIQUES

CROSS REFERENCE TO RELATED APPLICATION

This application is a continuation of application Ser. No. 08/944,684, filed Sep. 30, 1997, now U.S. Pat. No. 5,985,377, which is a continuation of application Ser. No. 08/584,246, filed Jan. 11, 1996, abandoned.

BACKGROUND OF THE INVENTION

1. Field of the Invention

This invention relates generally to laser marking techniques and, more specifically, to an apparatus and method for marking the surface of a bare or packaged semiconductor device, comprising one or more dice, using a laser and a laser reactive material.

2. State of the Art

Since the first semiconductor devices became commercially available, manufacturers have found it necessary to mark each chip or assembly of chips (bare die or package) with the company name, a part or serial number, or other information such as lot number or die location. Conventional marking methods utilize a mechanical device to transfer ink contained in an ink pad to the surface of a stamp. An individual chip is then stamped, and the automated process is repeated for subsequent chips.

Because of its mechanical nature and the drying time associated with ink, an ink stamping process is relatively slow. Moreover, if the mark is accidentally touched prior to complete drying, the mark will smudge. In chip manufacturing processes using such an ink stamping method, the ink marking operation may have to be included at a relatively early stage of production (if the die itself is to be marked) or just after post-encapsulation processing (if the package is to be marked) to allow for drying time without affecting the production rate. Such early marking may result, however, in marking defective chips that never make it completely through the manufacturing process.

Another problem associated with ink stamping methods is that the quality of ink stamped marks may substantially vary over time. This variation may be dependent upon the quantity of ink applied, ambient temperature and humidity, and/or the condition of the surface of the stamp. In any event, the consistency of a stamped mark may vary widely from chip to chip.

As a result of the deficiencies associated with ink stamping, it has become increasingly popular to use a laser beam to mark the surface of a chip. Unlike ink stamping, laser marking is very fast, requires no curing time, has a consistently high quality, and can take place at the end of the manufacturing process so that only good chips are marked.

Various machines and methods have been developed for marking a chip with a laser. As illustrated in U.S. Pat. 5,357,077 to Tsuruta, 5,329,090 to Woelki et al., 4,945,204 to Nakamura et al., 4,638,144 to Latta, Jr., 4,585,931 to Duncan et al., 4,375,025 to Carlson, a semiconductor device is placed in a position where a laser beam, usually produced by a carbon dioxide, Nd:YAG, or Nd:YLF laser, inscribes various characters or other information on a surface of the semiconductor device. Basically, the laser beam burns the surface of the chip such that a different reflectivity from the rest of the chip surface is formed. By holding the chip at a proper angle to a light source, the information inscribed on the chip by the laser can be read. Various materials are known in the art that are laser reactive (e.g., capable of changing color when contacted by a laser beam). As described in U.S. Pat. Nos. 4,861,620 to Azuma et al., 4,753,863 to Spanjer, and 4,707,722 to Folk et al., the part or component may be partially comprised of the laser markable material or have a coating of the material on the surface of the part or component to be marked.

Using a laser to mark a chip is a fast and economical means of marking. There are, however, certain disadvantages associated with state-of-the-art laser marking techniques that merely burn the surface to achieve the desired mark in comparison to ink stamping. For example, ink stamping provides a clearly visible image on the surface of a chip at nearly every angle of incidence to a light source. A mark burned in a surface by a laser, on the other hand, may only be visible at select angles of incidence to a light source. Further, oils or other contaminants deposited on the chip surface subsequent to marking may blur or even obscure the mark. Additionally, because the laser actually burns the surface of the work piece, for bare die marking, the associated burning may damage the internal circuitry of the chip directly or by increasing internal die temperature beyond acceptable limits. Moreover, where the manufactured part is not produced of a laser reactive material, laser reactive coatings applied to the surface of a component may take hours to cure.

Thus, it would be advantageous to provide a marking technique that combines the speed and precision of laser marking with the contrast and distinctiveness of ink stamping, without any substantial curing or drying time. Moreover, it would be advantageous to develop a method and apparatus for marking the surface of a semiconductor chip that does not harm the circuitry enclosed therein.

SUMMARY OF THE INVENTION

According to the present invention, a laser marking apparatus and method are disclosed wherein an object is subjected to a laser beam or other suitable energy source for marking purposes. While the laser beam is actively marking, a substance is introduced into the marking work area that interacts with the laser beam. The substance reacts with the localized heat created by the laser and forms a new compound on the surface of the package or surface of the chip. This new compound is selected to contrast highly with the color and/or surface texture of the surface that has been marked.

In another particular aspect of the invention, the surface of a chip is at least partially covered with a laser reactive substance prior to being contacted by a laser beam. The substance may be in either liquid or powder form and may be rolled on, sprayed on, or otherwise applied by means known in the art. When subjected to the localized heat created by the laser, a semi-permanent, solvent-removable mark is formed and bonded to the surface of the chip. The excess material on the non-irradiated portion, that is, the portion of the surface not contacted by the laser beam, is readily removed by an exhaust or residue removal system and may be recycled for future marking.

In another, more particular aspect of the invention, an ink bearing material, or other pigmented or laser reactive substance-bearing material, is disposed adjacent to an exposed surface of a chip. The laser beam transfers ink contained in the ink bearing material to the exposed surface of the chip. For example, the ink bearing material may comprise a ribbon contained in a ribbon dispenser. During the marking process, as the laser beam transfers ink from one point on the ribbon to the chip, another segment of the ribbon may be exposed to the laser beam for subsequent markings. Such an ink bearing material may also help to reduce heat produced by the laser beam from substantially penetrating the surface of the marked chip.

In a more particular aspect of the invention, a stream of atomized particles of B-stage epoxy with an added pigment of a desired color (white for example) is directed at the surface where the laser is actively marking the specimen. The epoxy reacts to the heat of the laser and cures to a visible white image coincident with the path of the laser. The excess particles, those which have not been directly irradiated by the laser beam, may be removed along with other debris from the work area by a debris removal system.

In another, more particular aspect of the invention, much of the epoxy is destroyed by the laser. A thermal gradient, however, along the trailing edge of the laser path causes the epoxy to cure normally into a final and permanent state, thus producing the desired mark.

In another particular aspect of the invention, the laser reactive material absorbs most of the heat produced by the laser. As a result, the delicate internal circuitry of the chip is not exposed to this potentially damaging heat.

In another aspect of the invention, subsequent to, or while being marked, the chip is subjected to a jet of coolant to rapidly cool the markings and prevent or reduce the potential for heat damage to the chip. The coolant may be in a liquid, gas, or solid state. In this manner, any residual heat contained in the marking material or present in the surface of the chip may be rapidly dissipated. The markings are thus completely cured and/or cooled before exiting the marking apparatus.

In another, more particular aspect of the invention, the laser marking apparatus is computer controlled. In addition to controlling the laser beam, chip location, and other process parameters, the central processing unit (CPU) may control the quality of markings. If so, the marked chips may be subjected to a camera which feeds an image of each chip to the CPU. The CPU compares the pixels of the captured image to a given resolution standard. If the marking is of a sufficiently high quality, the chips are automatically accepted. If not, the chips are automatically rejected for rework and remarking.

BRIEF DESCRIPTION OF THE SEVERAL VIEWS OF THE DRAWINGS

FIG. 5 is a perspective view of a portion of track in accordance with the chip carrier shown in FIG. 4;

FIG. 6 is a close-up schematic side view of a first embodiment of a laser marking apparatus in accordance with the present invention;

DETAILED DESCRIPTION OF THE INVENTION

Figure 1:
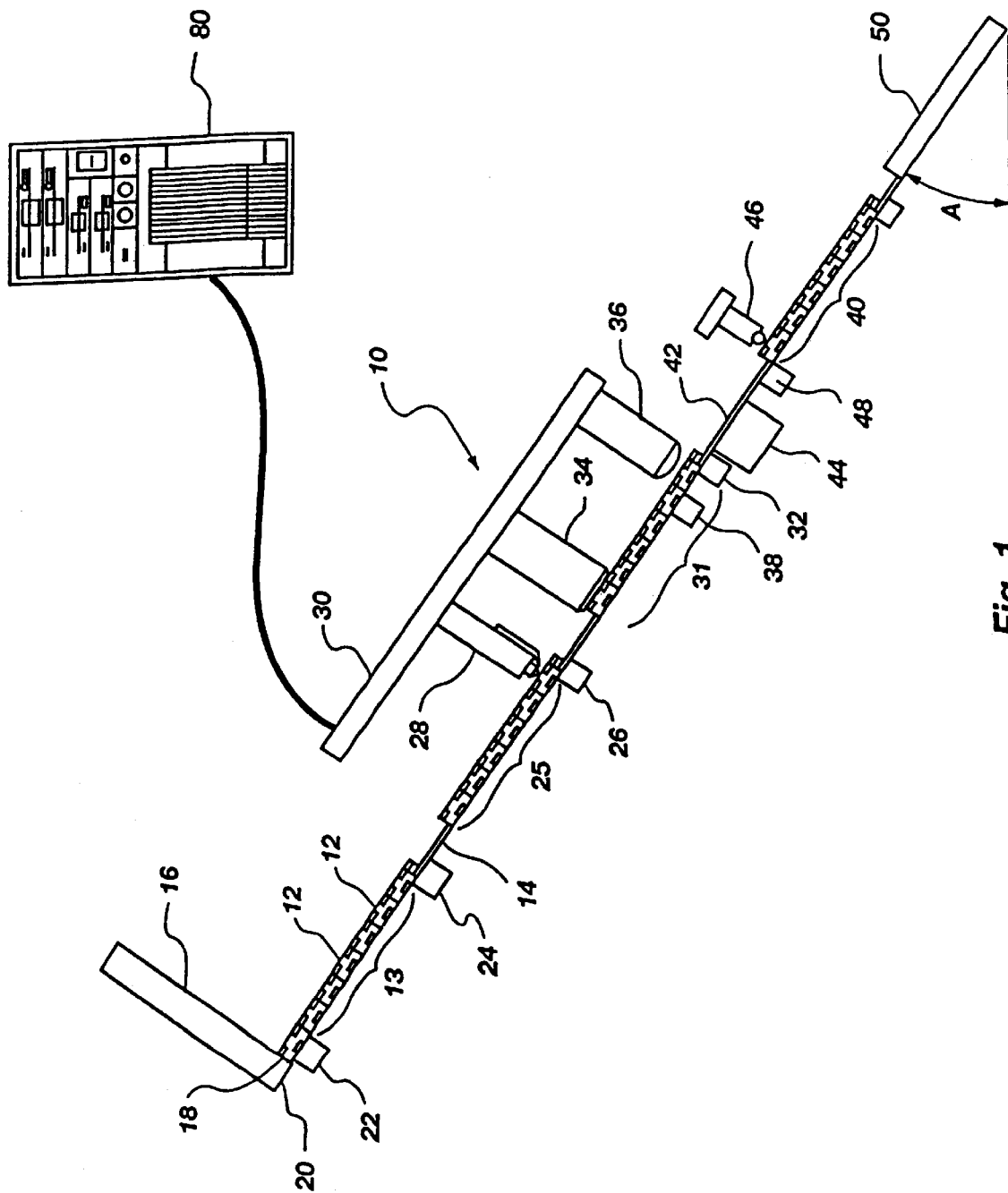
FIG. 1 is a schematic side view of a laser marking apparatus in accordance with the present invention.
Figure 3:
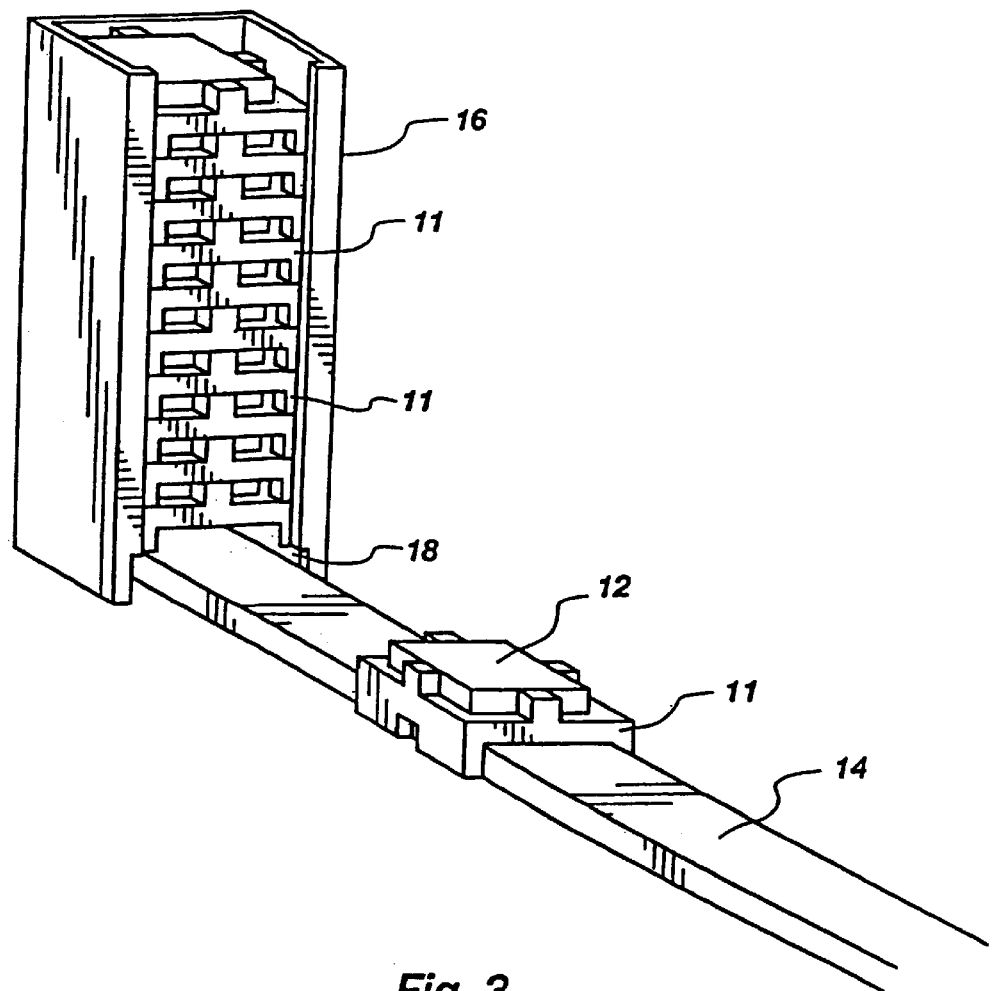
FIG. 3 is a close-up perspective view of a magazine and chips contained therein in accordance with the invention shown in FIG. 1.

Referring to FIG. 1, a laser marking apparatus 10 in accordance with the present invention is illustrated. Generally, the chips (the term "chips" as used herein refers to both bare and packaged dice, as the invention has equal utility in the marking of both) 12 are automatically fed through the laser marking apparatus 10 for marking purposes. The chips 12 may be fed by a belt, chain, or pneumatic conveyor system as known in the art, gravity fed as shown in FIG. 1, or delivered by other means known in the art. The chips 12 are first stacked in a feed magazine 16 (FIG. 3). When released from feed magazine 16 by a mechanical release mechanism as known in the art, the chips 12 exit through an opening 18 located proximate the bottom 20 of the feed magazine 16 onto the low-friction track 14.

Figure 2:
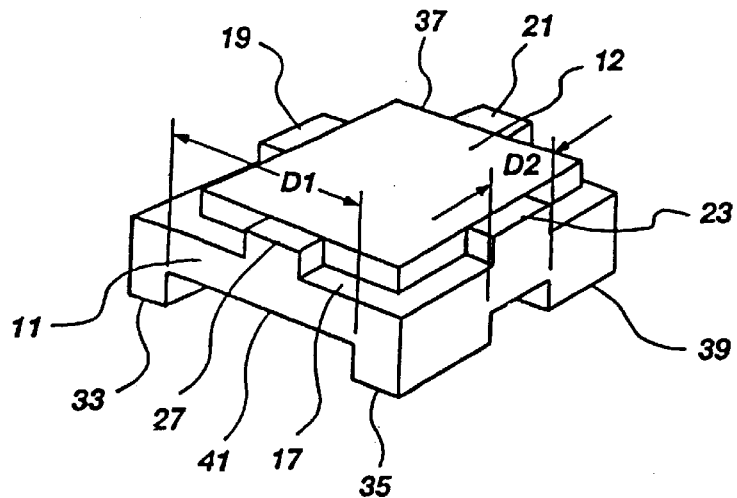
FIG. 2 is a perspective view of a chip contained in a first embodiment of a chip carrier in accordance with the invention shown in FIG. 1.

As shown in FIG. 2, the chips 12 are secured in carriers 11, preferably made of a statically dissipative material, such as certain plastics and other materials known in the art. The chip carriers 11 may be used to handle the chips 12 during many phases of the manufacturing process, up to and including shipment. The chips 12 are placed on a base 17 and held in place by projections 19, 21, 23, and 27. Legs 33, 35, 37 and 39 extend downwardly from the bottom 41 of the base 17. The legs 33 and 35, as well as legs 37 and 39, are separated by a distance D1 sufficient to allow passage of the track 14. Moreover, legs 35 and 39, as well as legs 33 and 37, are separated by a distance D2 to allow projections 23 and 19 to fit respectively therein whenever the chips 12 are stacked in their respective carriers 11.

As seen in FIG. 3, the chips 12 are stacked in the feed magazine 16. The chips 12, suspended above the track 14 by the feed magazine 16, are individually released onto the track 14 and allowed to slide by the force of gravity down the track 14. The feed magazine 16 automatically releases the chips 12 at constant or selectively variable intervals dictated by process requirements. The feed magazine 16 may vary in size to accommodate large or small numbers of chips 12 and each carrier 11 may vary in size to accommodate one or more dice.

Figure 4:
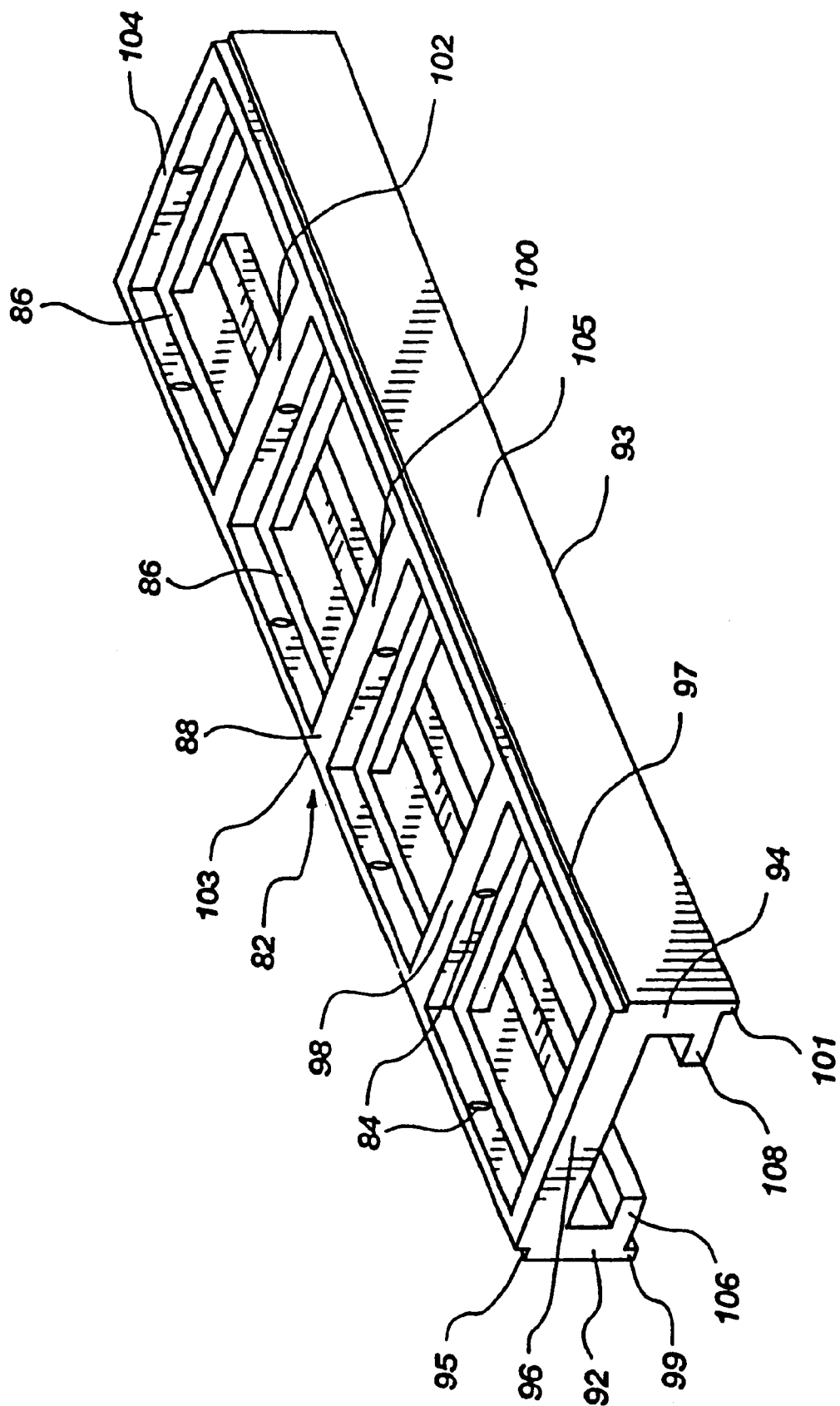
FIG. 4 is a perspective view of a second embodiment of a chip carrier in accordance with the present invention.

Carriers 11 may also be in elongated form to accommodate a plurality of chips 12 to be marked. As depicted in FIG. 4, an empty chip carrier 82 is capable of holding at least four (4) chips 12. The chip carrier 82 may also be modified to hold several dice that have not been cut apart (if increased in size) or an entire wafer (if modified to hold round rather than rectangular objects). Chips 12 are held in the carrier 82 by elements 84 which provide an interference or resiliently-biased fit as desired between the carrier 82 and a chip 12. Moreover, the chips 12 rest upon the lip 86 so that each chip 12 held by the carrier 82 extends equally above the top surface 88 of the carrier 82.

The carrier 82 is adapted to slide along a track positioned in several different orientations, such as a track 90 shown in FIG. 5. The carrier 82 has legs 92 and 94 depending from and separated by cross-members 96, 98, 100, 102 and 104 extending the length of the carrier 82. The legs 92 and 94 are parallel to each other, have lateral extensions 106 and 108, respectively, spaced from the cross-members 96, 98, 100, and 102 running the length of the legs 92 and 94 and projecting inwardly for grasping the elongate rails 110 and 112 of the track 90.

The rails 110 and 112 of the track 90 are shown oriented back-to-back and having a "C" shaped cross-section and are spaced apart by members 107. When the carrier 82 is riding on the top of the track 90, the lateral extensions 106 and 108 grasp the top portions 114 and 116 of the rails 110 and 112, respectively. If the carrier 82 is suspended from the bottom of the track 90 (in an inverted orientation), the lateral extensions 106 and 108 grasp the bottom portions 118 and 120, respectively. Moreover, because the carrier 82 is designed to actually grasp the track 90 rather than merely ride on it, the track may be placed in any orientation.

When the chips 12 are placed in the carrier 82 and the carrier 82 is positioned on the track 90, the marking operation may occur on either side. That is, because both sides of the chip 12 are exposed, neither the top nor the bottom of the chip 12 has any substantial portion covered by the carrier 82. If the chips 12 in the carrier 82 are automatically inspected, defective chips 12 may be automatically popped out of the carrier 82. A solvent or other substance, or even a de-marking laser; may be used to remove the defective mark and the chip 12 may then be reloaded into a carrier 82 and remarked. Thus, the requirements of the process and of the marking and inspection apparatus can dictate the orientation of the track 90, the carriers 82 thereon, and the chips 12 in the carriers 82.

The carrier 82 is also suited for stacking with other similar carriers. Extending longitudinally along the length of the top surface 88 of the outside edges 103 and 105 of the carrier 82 are channels 95 and 97 sized and shaped to receive extensions 99 and 101 extending downwardly from legs 92 and 94, respectively. The extension 99 and 101 also extend longitudinally the length of the carrier 82 along the bottom 93 of the carrier 82. The extensions 99 and 101 extend downwardly from the lateral extensions 106 and 108, respectively, a sufficient distance so that when stacked, the lateral extensions 106 and 108 are spaced above the chips 12 contained in the carrier 82.

For typical packaged dice (chips) 122, such as that shown in FIG. 6, the chip 122 can ride directly on the track 14 without being placed in a carrier. The connecting tabs 124 located on the sides 126 and 128 of the chip 122 keep the chip 122 properly aligned on the track 14. Moreover, the track 14 is of a width W so that the chips 122 stay in longitudinal and latitudinal alignment with the track 14. The chips 122 can also be loaded onto the track 14 by a feed magazine of a modified version of feed magazine 16 and loaded into a shipping magazine such as tubular shipping magazine 50 (FIG. 1).

FIG. 1 shows laser marking apparatus 10 of the present invention in a gravity feed arrangement where the track 14 is placed at an angle A relative to the horizon such that the force of static friction between the carriers 11 and the track 14 is less than the force of gravity along the line of the track 14 on the carriers 11. When the chips 12 are released from the feed magazine 16, several chips 12 are staged, six (6) in this case, by automated indexing pins 22 and 24 at the initial staging area 13. Once the chips 12 are staged, indexing pin 24 is retracted to allow the staged chips 12 to slide on the track 14 until stopped by indexing pin 26 at the marking area 25. The chips 12 are held in place by indexing pin 26 until all of the chips 12 retained by indexing pin 26 are marked by the laser 28. The laser 28 may be comprised of a carbon dioxide, Nd:YAG, Nd:YLF laser or other suitable lasers or devices, such as an electron beam emitter, known in the art. The laser 28 is longitudinally translatable along the support 30 in at least one direction so that all of the chips 12 retained by indexing pin 26 can be marked by the laser 28 in a single pass.

Once the laser 28 marks the chips 12, indexing pin 26 is retracted and the chips 12 are allowed to slide until retained by indexing pin 32 at the debris removal and inspection area 31. As the chips 12 pass from indexing pin 26 to indexing pin 32, they slide under the debris removal system 34. The debris removal system 34 may employ suction, forced air and/or other methods known in the art to clean the surface 54 of the chip 12 (FIG. 7) without disturbing the markings thereon (not shown). Moreover, any marking material that remains in the recovered residue may be reprocessed for future chip marking.

The chip 12 adjacent the indexing pin 32 is then inspected by the camera 36 which may be a CCD camera or other suitable camera known in the art. That is, the camera 36 photographs the image of the surface 54 of the chip 12 and the markings contained thereon and sends this image to a central processing unit, such as CPU 80 in FIG. 1. The image received by the CPU 80 is broken down into individual pixels and the pixels are compared to a minimum standard. Once the image is received and compared by the CPU 80, each chip 12 is released by the indexing pin 32. The adjacent, upstream chips 12 are maintained in position by the indexing pin 38 until each is released for inspection. If the chip 12 released by the indexing pin 32 is acceptable according to the comparison made by the CPU 80, then the chip 12 is allowed to slide on the track 14 to the final staging area 40. If the chip 12 is determined by the CPU 80 to be unacceptable, a trap door 42 is opened and the chip 12 falls into a bin 44 so that the chip 12 may be reworked and remarked.

An electronic eye 46 is positioned to identify when a proper number, in this case six (6), of acceptable chips 12 are ready to be packaged. Once the proper number of chips 12 is achieved, the indexing pin 48 is activated until all of the chips 12 held in the final staging area 40 have been loaded into a shipping magazine 50.

The apparatus 10 disclosed herein only requires an operator to load the feed magazine 16 with chips 12 to be marked and to remove and replace the shipping magazine 50 when full. The rest of the marking/inspection operation is completely automated and controlled by the CPU 80. Moreover, it is possible for the CPU 80 to control multiple track arrangements simultaneously.

Figure 7:
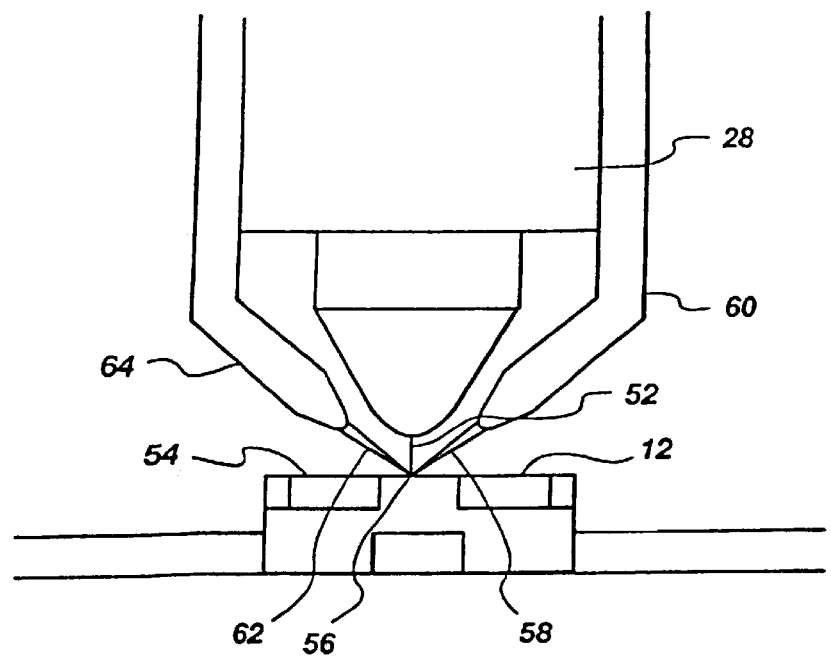
FIG. 7 is a close-up schematic side view of a second embodiment of a laser marking apparatus in accordance with the present invention.

Referring now to FIG. 7, a close-up view of the laser 28 in relation to the chip 12 is shown. The laser 28 projects a movable laser beam 52 onto the surface 54 of the chip 12 to mark the chip 12. As the laser beam 52 is directed toward the chip surface 54, a laser reactive marking material 58 is injected through an applicator or nozzle 60 onto the chip surface 54 at the same location 56 that the beam contacts the chip 12. The heat from the laser beam 52 fuses the laser reactive marking material 58 onto the chip surface 54. Laser reactive marking material 58 present on any non-irradiated portion of the chip 12 that has not been exposed to the laser beam 52 and is therefore unreacted does not bond to the chip surface 54 and is subsequently removed.

A coolant 62 may also be injected from a coolant injector or nozzle 64 onto the surface 54 of the chip 12 and onto the marking material 58 present on the chip surface 54. If a coolant 62 is used, any residual heat contained in the chip 12 or the marking material 58 may be quickly dissipated. This may be necessary to help protect the delicate circuitry of a bare die from the heat of the laser beam 52. The laser 28 is shown without the coolant nozzle 64 in FIG. 1. The use of a coolant 62 also prevents or insures the laser reactive marking material 58, which may be an epoxy material that may cure at a relatively low temperature, from curing prematurely, thereby decreasing the need for relatively high curing temperature epoxies to be used in the marking process.

As can be seen, both the pigment nozzle 60 and the coolant nozzle 64 are attached to the laser 28 so that any movement of the laser results in movement of the nozzles 60 and 64. Thus, the laser 28 and the nozzles 60 and 64 translate together, and are thus synchronous, so that a minimum amount of laser reactive marking material 58 and coolant 62 is required. Moreover, the marking location immediately surrounding the target surface on each chip 12 for laser beam 52 may be placed in a reduced or negative pressure environment with respect to the surrounding work area by means known in the art to reduce overspray that may otherwise settle on the chip 12 or drift onto the track 14 or other parts of the apparatus 10.

Figure 8:
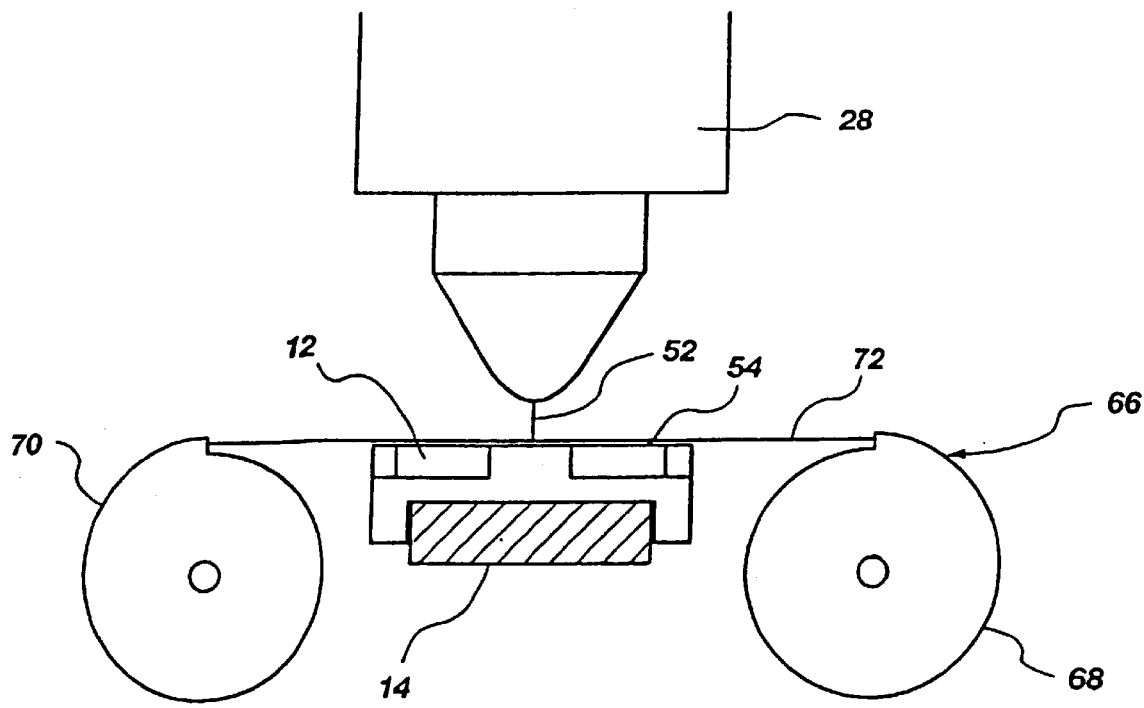
FIG. 8 is a close-up schematic side view of an alternate embodiment of a roller-type applicator in accordance with the present invention.

In FIG. 8, an alternate embodiment is shown having a ribbon dispenser 66 comprised of a feed reel 68 and a take-up reel 70. The ribbon dispenser 66 dispenses a ribbon or strip of ink bearing material 72 from the feed real 68 to the take-up reel 70. The ribbon 72 extends over and is proximate to the surface 54 of the chip 12. The ribbon 72 may also extend over a number of chips 12 or several ribbon dispensers 66 may be placed side by side so that marking of several chips 12 can occur sequentially or so that multiple colors may be used in the marking process. The chips 12 are allowed to pass under the ribbon 72 as they slide along the track 14. When the chips have moved to the marking area 25, the laser 28 projects a laser beam 52 onto the surface of the ribbon 72 and transfers ink from the ribbon 72 onto the surface 54 of the chip 12. One advantage of the embodiment of FIG. 8 is the elimination of liquid pigments and coolants, the latter being due to absorbance of the laser energy by the ribbon 72 carrying the marking material. Another advantage is that the marking process using a ribbon 72 is cleaner in that no excess particles of marking material are present in the marking area to contaminate the marking area and chip in undesired areas.

Figure 9:
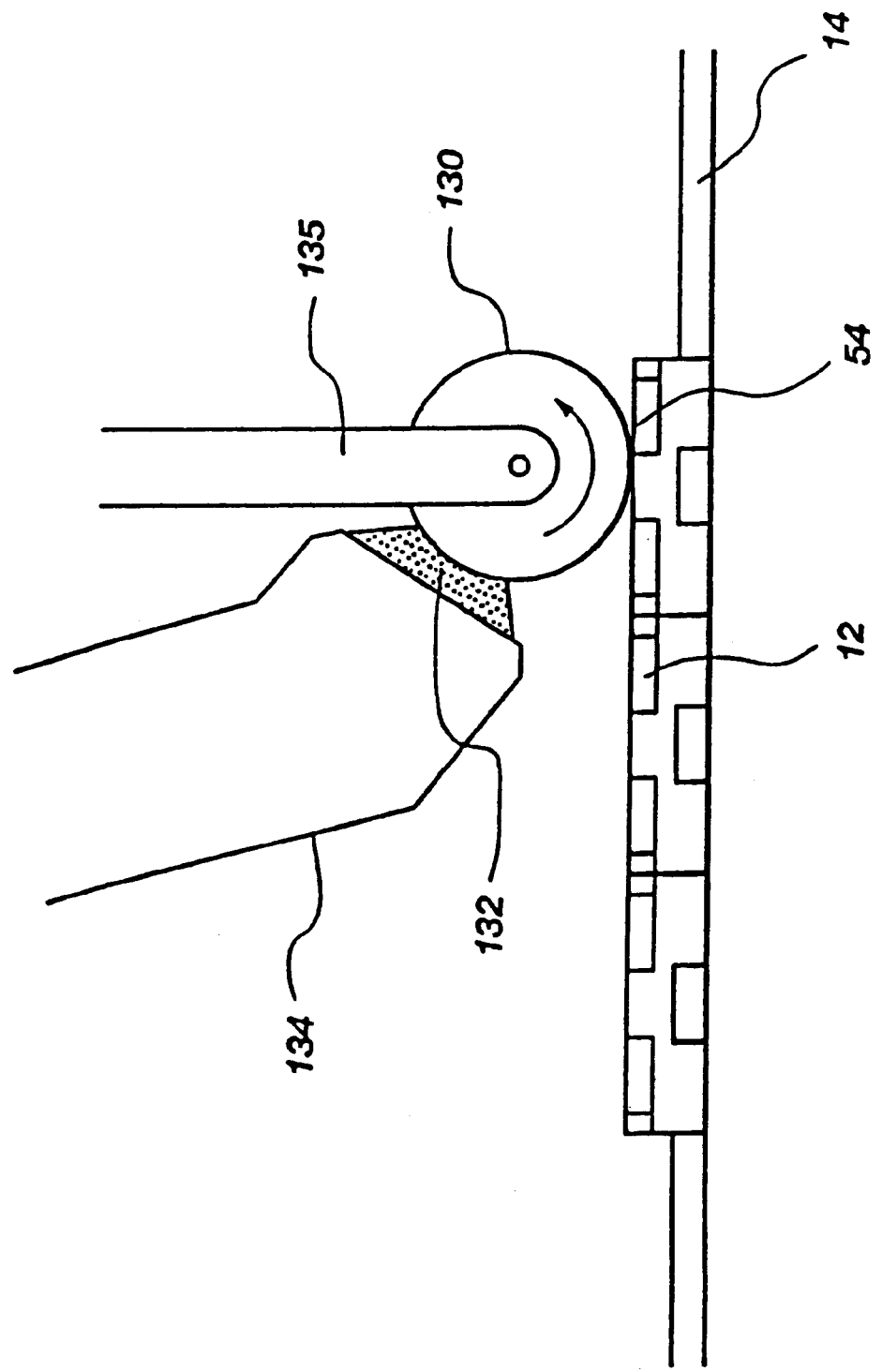
FIG. 9 is a perspective view of a packaged semiconductor device positioned on a track in accordance with the present invention.

Referring to FIG. 9, the laser reactive material may be applied by a motorized roller 130 rotatably attached to a roller support 135. An open-celled sponge or fiber pad 132 is held against the roller 130 by a support member 134. The support member also supplies the laser reactive material to the pad 132, the arrangement functioning like a shoe-polish applicator. The roller is held in contact with the top surface 54 of the chips 12 and forces the chips 12 between the roller and the track 14. Because the pad 132 continually supplies laser reactive material to the roller 130, each chip 12 receives a consistent layer of material. The chips 12 can then be laser marked. The application of laser reactive material to the roller 130 could also be achieved by spray, drip or other methods known in the art.

While the present invention has been described in terms of certain preferred embodiments, it is not so limited, and those of ordinary skill in the art will readily recognize and appreciate that many additions, deletions and modifications to the embodiments described herein may be made without departing from the scope of the invention as hereinafter claimed. As used in the claims, as in the preceding specification, the term "chip" or "chips" is intended to mean and encompass both bare, both the circuit side and/or back (Si) side of the semiconductor dice, and packaged semiconductor dice.

Additionally, while the invention has been described in conjunction with the use of a laser as an energy source for the marking of a chip or chips, any suitable energy source may be used in place of the laser energy source, such as a focused ultraviolet light source, electron beam, focused and directed hot air source, etc.

What is claimed is:

1. A method of marking an encapsulant of a packaged semiconductor device, comprising:

disposing an energy reactive marking material onto a surface of the encapsulant;

directing an energy beam onto selected portions of said energy reactive marking material to form a mark on said surface without creating an imprint in said surface; and removing an unbounded quantity of said energy reactive marking material from said surface.

2. The method of claim 1 wherein said disposing comprises directing a stream of said energy reactive marking material proximate locations of said surface where said energy beam is directed.

3. The method of claim 2, further comprising translating said energy beam with said stream of said energy reactive marking material.

4. The method of claim 1, further comprising placing the packaged semiconductor device in a path of said energy beam.

5. The method of claim 1, wherein said disposing comprises disposing an energy reactive marking material comprising a pigment onto said surface.

6. The method of claim 1, wherein said directing said energy beam effects a color reaction of said energy reactive marking material.

7. The method of claim 1, wherein said directing said energy beam effects an absorption of energy by said energy reactive marking material.

8. The method of claim 1, wherein said disposing comprises disposing a quickly curing energy reactive marking material onto said surface.

9. The method of claim 1, wherein said directing said energy beam forms said mark with a non-wet finish.

10. The method of claim 1, further comprising inspecting a quality of said mark.

11. The method of claim 10, further comprising rejecting the packaged semiconductor device if said mark is not within selected quality control parameters.

12. The method of claim 1, further comprising directing a coolant onto said selected portions either during or immediately subsequent to said directing said energy beam.

13. The method of claim 1, wherein said directing said energy beam comprises directing a laser beam onto said selected portions.

14. The method of claim 1, wherein said directing said energy beam comprises directing focused light onto said selected portions.

15. The method of claim 1, wherein said directing said energy beam comprises directing heat onto said selected portions.

16. The method of claim 1, wherein said disposing and said directing occur without damaging or decomposing said selected portions.

17. A method of marking a surface of a substantially bare semiconductor chip, comprising:

applying energy reactive marking material onto the surface; and directing an energy beam onto selected areas of said energy reactive marking material to effect the transfer of pigment from said selected areas to the surface so as to form a mark on said surface without creating an imprint in said surface.

18. The method of claim 17, wherein said applying comprises directing a stream of said energy reactive marking material proximate locations of said surface where said energy beam is directed.

19. The method of claim 18, further comprising translating said energy beam with said stream of said energy reactive marking material.

20. The method of claim 17, further comprising placing the substantially bare semiconductor chip in a path of said energy beam.

21. The method of claim 17, wherein said applying comprises applying an energy reactive marking material comprising a color reactive material onto the surface.

22. The method of claim 17, wherein said applying comprises applying an energy reactive marking material comprising an energy absorbent material onto the surface.

23. The method of claim 17, wherein said applying comprises applying an energy reactive marking material comprising a material that cures to a non-wet finish when contacted by said energy beam.

24. The method of claim 17, further comprising removing debris including unbounded energy reactive marking material from said surface.

25. The method of claim 17 further comprising inspecting a quality of said mark.

26. The method of claim 25, further comprising rejecting the substantially bare semiconductor chip if said mark is not within selected quality control parameters.

27. The method of claim 17, further comprising introducing a coolant onto said selected areas either during or immediately subsequent to said directing said energy beam.

28. The method of claim 17, wherein said directing forms said mark without damaging or decomposing the substantially bare semiconductor chip.

29. The method of claim 17, wherein said directing said energy beam comprises directing a laser beam onto said selected portions.

30. The method of claim 17, wherein said directing said energy beam comprises directing focused light onto said selected portions.

31. The method of claim 17, wherein said directing said energy beam comprises directing heat onto said selected portions.

32. The method of claim 17, wherein said applying comprises applying an energy reactive marking material comprising a solvent-removable pigment to the surface.

33. The method of claim 17, wherein said applying said energy reactive marking material follows said directing said energy beam.

34. The method of claim 17, wherein said applying and said directing are effected substantially simultaneously.

35. A method of marking a semiconductor chip, comprising:
  directing an energy beam onto selected regions of a surface of the semiconductor chip; and
  disposing an energy reactive material on said surface following said directing to bond said energy reactive material to said selected regions without creating an imprint in said surface.

36. The method of claim 35, wherein said disposing comprises directing said energy reactive material onto said selected regions.

37. The method of claim 35, wherein said disposing comprises disposing an energy reactive material comprising a color reactive material on said surface.

38. The method of claim 35, wherein said disposing comprises disposing an energy reactive material comprising an energy absorbent material on said surface.

39. The method of claim 35, wherein said disposing comprises disposing on said surface an energy reactive material comprising a material that cures to a non-wet finish when contacted by said energy beam.

40. The method of claim 35, further comprising removing debris including unbounded energy reactive material from said surface.

41. The method of claim 35, further comprising inspecting a quality of a mark comprising said energy reactive material.

42. The method of claim 41, further comprising rejecting said semiconductor chip if said mark is not within selected quality control parameters.

43. The method of claim 35, further comprising introducing a coolant onto said surface either during or immediately subsequent to said disposing.

44. The method of claim 35, wherein said directing and said disposing said energy reactive material comprise bonding said energy reactive material onto said surface without damaging or decomposing said surface.

45. The method of claim 35, wherein said directing said energy beam comprises directing a laser beam onto said selected regions.

46. The method of claim 35, wherein said directing said energy beam comprises directing focused light onto said selected regions.

47. The method of claim 35, wherein said directing said energy beam comprises directing heat onto said selected regions.

48. The method of claim 35, wherein said disposing comprises disposing an energy reactive material comprising a solvent-removable pigment.

49. The method of claim 35, wherein said directing and said disposing effects a bonding of said energy reactive material to said surface at said selected regions.

* * * * *

UNITED STATES PATENT AND TRADEMARK OFFICE
CERTIFICATE OF CORRECTION

PATENT NO. : 6,113,992
DATED : September 5, 2000
INVENTOR(S) : Tim J. Corbett

It is certified that error appears in the above-identified patent and that said Letters Patent is hereby corrected as shown below:

<u>Title page, Item [54] and Column 1, line 1</u>,
Title, change "LASER MAKING TECHNIQUES" to -- LASER MARKING TECHNIQUES --.

<u>Column 5,</u>
Line 30, change "extension" to -- extensions --.

<u>Column 6,</u>
Lines 60 and 62, change "marking material 58" to -- laser reactive marking material 58 --.
Line 66, change "insures" to -- ensures --.

<u>Column 7,</u>
Line 21, change "real" to -- reel --.

<u>Column 9,</u>
Line 24, change "unbounded" to -- unbonded --.

<u>Column 10,</u>
Line 22, change "unbounded" to -- unbonded --.

Signed and Sealed this

Twenty-fourth Day of January, 2006

JON W. DUDAS
*Director of the United States Patent and Trademark Office*